(12) United States Patent
Khaddam-Aljameh et al.

(10) Patent No.: US 12,125,531 B2
(45) Date of Patent: Oct. 22, 2024

(54) RESISTIVE MEMORY DEVICE FOR MATRIX-VECTOR MULTIPLICATIONS

(71) Applicant: International Business Machines Corporation, Armonk, NY (US)

(72) Inventors: Riduan Khaddam-Aljameh, Zurich (CH); Manuel Le Gallo-Bourdeau, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 898 days.

(21) Appl. No.: 17/196,568

(22) Filed: Mar. 9, 2021

(65) Prior Publication Data
US 2022/0293174 A1    Sep. 15, 2022

(51) Int. Cl.
| | |
|---|---|
| G11C 11/00 | (2006.01) |
| G06F 17/16 | (2006.01) |
| G06G 7/16 | (2006.01) |
| G11C 11/54 | (2006.01) |
| G11C 13/00 | (2006.01) |

(Continued)

(52) U.S. Cl.
CPC .......... G11C 13/0069 (2013.01); G06F 17/16 (2013.01); G06G 7/16 (2013.01); G11C 11/54 (2013.01); G11C 13/0004 (2013.01); G11C 13/004 (2013.01); G11C 11/1675 (2013.01); G11C 11/22 (2013.01); G11C 2213/79 (2013.01)

(58) Field of Classification Search
CPC . G11C 13/0069; G11C 11/54; G11C 13/0004; G11C 13/004; G11C 11/1675; G11C 11/22; G11C 2213/79; G06F 17/16; G06F 7/16

USPC ........................................................ 365/163
See application file for complete search history.

(56) References Cited

U.S. PATENT DOCUMENTS

| | | | |
|---|---|---|---|
| 7,391,664 B2 * | 6/2008 | Parkinson | G11C 7/18 365/189.04 |
| 8,625,333 B2 * | 1/2014 | Rao | G11C 11/419 365/154 |

(Continued)

FOREIGN PATENT DOCUMENTS

| | | |
|---|---|---|
| CN | 109144469 A | 1/2019 |
| CN | 106909970 B | 4/2020 |

OTHER PUBLICATIONS

"Patent Cooperation Treaty International Search Report", Applicant's or agent's file reference: P202003301, International application No. PCT /IB2022/051322, International filing date: Feb. 15, 2022, Date of mailing of the international search report, May 30, 2022, 6 pgs.

*Primary Examiner* — Viet Q Nguyen
(74) *Attorney, Agent, or Firm* — Daniel M. Yeates (57) ABSTRACT

A device for performing a matrix-vector multiplication of a matrix with a vector. The device comprising a memory crossbar array comprising a plurality of row lines, a plurality of column lines and a plurality of junctions arranged between the plurality of row lines and the plurality of column lines. Each junction comprises a programmable resistive element and an access element for accessing the programmable resistive element. The memory crossbar array further comprises one or more write-assist wires and one or more corresponding arrays of switching elements. The write-assist wires are connectable via the switching elements to the plurality of column lines.

20 Claims, 8 Drawing Sheets

(51) Int. Cl.
    *G11C 11/16*          (2006.01)
    *G11C 11/22*          (2006.01)

(56)            References Cited

U.S. PATENT DOCUMENTS

| | | | |
|---|---|---|---|
| 8,730,712 B2 * | 5/2014 | Choi | G11C 11/413 |
| | | | 365/189.16 |
| 9,152,827 B2 | 10/2015 | Linderman | |
| 9,418,739 B2 * | 8/2016 | Lee | G11C 13/0069 |
| 10,241,971 B2 | 3/2019 | Muralimanohar | |
| 10,497,440 B2 | 12/2019 | Hu | |
| 10,522,223 B1 | 12/2019 | Le Gallo-Bourdeau | |
| 10,665,281 B1 * | 5/2020 | Jacob | G11C 11/1653 |
| 10,885,954 B2 * | 1/2021 | Baeck | G11C 8/16 |
| 11,444,124 B2 * | 9/2022 | Cheng | G11C 13/0028 |
| 11,670,360 B2 * | 6/2023 | Choi | G11C 11/4099 |
| | | | 365/185.13 |
| 2015/0103604 A1 * | 4/2015 | Sheikh | G11C 11/419 |
| | | | 365/189.05 |
| 2016/0247565 A1 | 8/2016 | Perner | |
| 2018/0173677 A1 | 6/2018 | Muralimanohar | |
| 2019/0027217 A1 | 1/2019 | Strachan | |
| 2020/0279012 A1 | 9/2020 | Khaddam-Aljameh | |

* cited by examiner

RESISTIVE MEMORY DEVICE FOR MATRIX-VECTOR MULTIPLICATIONS

BACKGROUND

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

SUMMARY

According to an aspect, the disclosure is embodied as device for performing a matrix-vector multiplication of a matrix with a vector. The device comprises a memory crossbar array comprising a plurality of row lines, a plurality of column lines and a plurality of junctions arranged between the plurality of row lines and the plurality of column lines. Each junction comprises a programmable resistive element and an access element for accessing the programmable resistive element. The memory crossbar array further comprises one or more write-assist wires and one or more corresponding arrays of switching elements. The write-assist wires are connectable via the switching elements to the plurality of column lines.

The device is configured to perform write operations by applying programming signals to a subset of the plurality of row lines to program conductance values of the resistive elements for the matrix-vector multiplication and turning on the one or more write-assist wires during the write operations by means of the one or more arrays of switching elements, thereby providing one or more shunt paths for the programming signals during the write operations.

According to another aspect a design structure is provided. The design structure is tangibly embodied in a machine readable medium for designing, manufacturing, or testing an integrated circuit. The design structure comprises a device according to the previous aspect.

According to another aspect, a method for performing a matrix-vector multiplication of a matrix with a vector by means of a device of the previous aspect is provided. The method comprises performing write operations by applying programming signals to a subset of the plurality of row lines to program conductance values of the resistive elements for the matrix-vector multiplication and by turning on the one or more write-assist wires during the write operations by means of the one or more arrays of switching elements, thereby providing one or more shunt paths for the programming signals during the write operations.

Embodiments of the disclosure will be described in more detail below, by way of illustrative and non-limiting examples, with reference to the accompanying drawings.

DETAILED DESCRIPTION

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a key non-Von Neumann approach being researched. A key element in this novel computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

However, many challenges remain to be solved in order to perform accurate matrix-vector computations in an array of memory devices in an efficient way.

Accordingly, there is a need for new and improved memcomputing devices, in particular for memcomputing devices that can perform matrix-vector multiplications.

In reference to FIGS. 1-12, some general aspects and terms of embodiments of the disclosure are described.

According to embodiments of the disclosure, a resistive element may be defined as an element whose electrical resistance can be changed by applying an electrical programming signal to the resistive element. The resistive element may be in particular embodied as resistive memory element. The electrical programming signal may be, e.g., a current flowing through the resistive memory element, or an electrical voltage applied to the resistive memory element. The current and/or voltage may be, e.g., applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g., a chalcogenide. These resistive memory elements exhibit good performance in terms of power consumption, integration density potential, retention, and endurance.

Embodiments of the disclosure provide a way to do inexact fast matrix-vector multiplications. The result from this multiplication may preferably be used in algorithms that do not require high precision for multiplication tasks. Such an algorithm that could be used for the post-processing of the results of the multiplication according to embodiments of the disclosure is, e.g., the algorithm disclosed by Klavik et al. in "Changing Computing Paradigms Towards Power Efficiency", Proc. Royal Society A., 2014. The multiplication performed according to embodiments of the disclosure can be fast, low-power and may be scalable to matrix sizes of 10000×10000 and beyond.

Embodiments of the disclosure may bring significant power and/or speed advantages compared to the conventional Von-Neumann approach where the data has to be shuttled back and forth between a central processing unit (CPU) and the memory.

As a matrix-vector multiplication can be generalized to a matrix-matrix multiplication and to a vector-vector multiplication, the device and the methods according to embodiments of the disclosure can also be used to perform matrix-matrix multiplications and vector-vector multiplications.

Figure 1:
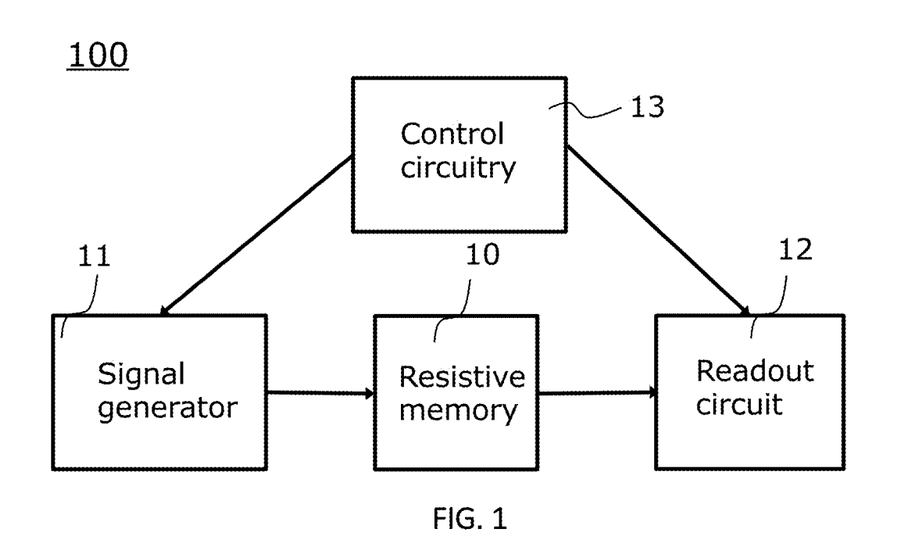
FIG. 1 is a simplified schematic block diagram of a device for performing a multiplication of a matrix with a vector according to an embodiment of the disclosure.

FIG. 1 is a simplified schematic block diagram of a device 100 for performing a multiplication of a matrix with a vector. The device 100 comprises a resistive memory 10 having a plurality of programmable resistive elements. Furthermore, a signal generator 11 is provided. The signal generator 11 is configured to apply electrical programming signals to the resistive elements of the resistive memory 10. The signal generator 11 comprises circuitry for programming the resistive memory cells during data write or programming operations such that a multiplication of a matrix with a vector can be performed. The row lines and column lines may also be denoted as word and bit lines. The signal generator 11 is configured to receive a matrix A as input and to apply programming signals to the resistive elements to program conductance values of the resistive elements for a matrix-vector multiplication.

The conductance values represent matrix values of the matrix that shall be multiplied with the vector.

In addition, the device 100 comprises a readout circuit 12 configured to read out resistance values of the resistive elements during data read operations. The device 100 is configured to apply read out voltages to the rows of the memory crossbar array. The read out voltages represent vector elements of the vector that shall be multiplied with the matrix. The device is further configured to read out current values of columns of the memory array. The current values represent result values of vector elements of a result vector of the multiplication.

The device 100 further comprises control circuitry 13 configured to control the signal generator 11 and the readout circuit 12.

The memory 10 may be generally any kind of resistive memory as described above. In particular it may be a phase change memory (PCM) or a resistive random access memory (RRAM). In the following it assumed that the resistive memory 10 is embodied as PCM. Accordingly the resistive memory 10 comprise a plurality of PCM cells as resistive memory elements. The PCM cells of memory 10 may comprise s=2 or s>2 programmable resistance states, the latter providing multilevel operation. The s programmable resistance-states correspond to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The s programmable cell-states are typically defined in terms of predetermined reference values, or ranges of values, of the resistance metric used for read detection by the readout circuit 12.

To perform a matrix-vector multiplication, the PCM cells are programmed according to embodiments in a kind of write operation. More particularly, the signal generator 11 applies a voltage to the cell via the column lines and row lines such that the resulting programming signal sets the cell to a state (conductance value) that represents a matrix element of the matrix that shall be multiplied with the vector. In a read operation, (lower) read voltages are applied to the column lines or row lines. Then the resulting current values of the row lines or column lines are read/measured to obtain the result vector.

Figure 2:
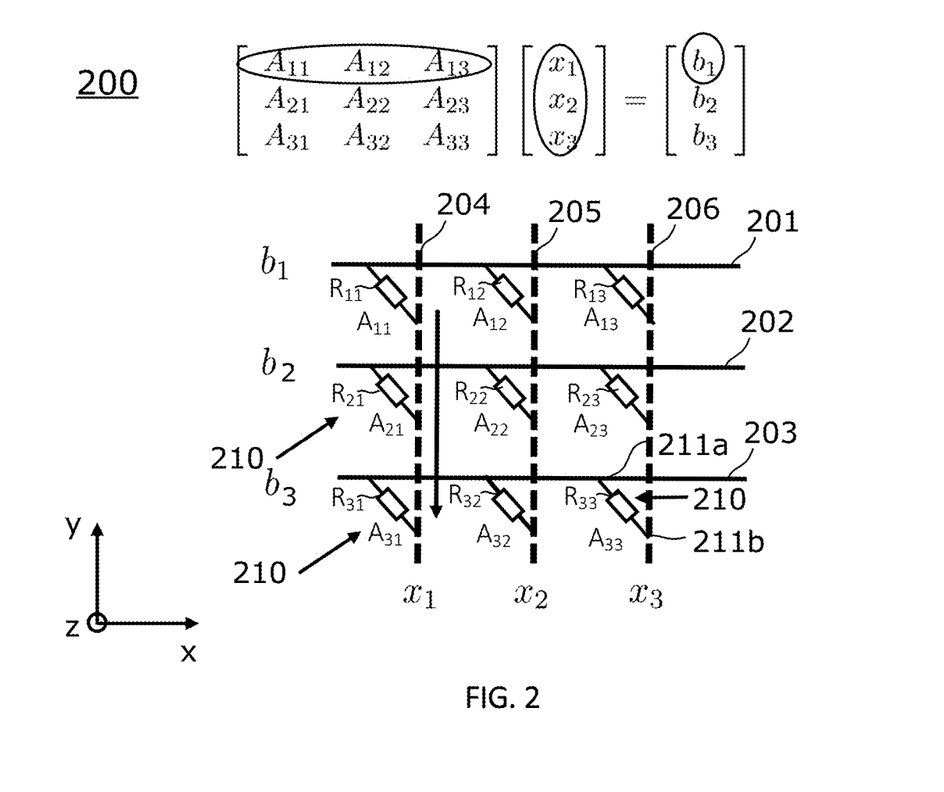
FIG. 2 illustrates an example of matrix-vector multiplication according to an embodiment of the disclosure.

FIG. 2 illustrates an example of a matrix multiplication according to an embodiment of the disclosure. The matrix multiplication uses Ohm's law and Kirchhoff's law in a resistive memory crossbar array.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and $A_{31}$, a second column consisting of the matrix elements $A_{12}$, $A_{22}$ and $A_{32}$ and a third column consisting of the matrix elements $A_{13}$, $A_{23}$ and $A_{33}$. The vector x comprises the vector elements $x_1$, $x_2$ and $x_3$.

For such a multiplication of the matrix A with the size 3×3, the resistive memory 10 comprises a memory crossbar array 200 of a corresponding size 3×3.

The memory crossbar array 200 comprises 3 row lines 201, 202 and 203 and three column lines 204, 205 and 206. The three row lines 201, 202 and 203 are arranged above the three column lines 204, 205 and 206 which is indicated by dotted lines. More particularly, the row lines 201, 202 and 203 extend in a first x-y-plane and the three column lines extend in a second x-y plane, wherein the first x-y plane is arranged in the vertical z-direction above the second x-y-plane.

The three row lines 201, 202 and 203 and the three column lines 204, 205 and 206 are connected to each other via vertical junctions 210. The junctions 210 extend in the vertical z-direction between upper cross points 211a of the row lines 201-203 and lower cross points 211b of the column lines 204-206.

Each junction 210 comprises a serial arrangement of a resistive memory element and a transistor. For ease of illustration, the transistors are not shown in FIG. 2.

More particularly, the crossbar array 200 comprises 9 resistive memory elements embodied as PCM cells. The row line 201 comprises resistive memory elements $R_{11}$, $R_{12}$ and $R_{13}$, the row line 202 comprises the memory elements $R_{21}$, $R_{22}$ and $R_{23}$ and the row line 203 the memory elements $R_{31}$, $R_{32}$ and $R_{33}$.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element $R_{11}$ is programmed to the matrix value $A_{11}$, the conductance of the resistive memory element $R_{12}$ is programmed to the matrix value $A_{12}$, or more generally the conductance of the resistive memory Rij is programmed to a corresponding matrix value Aij.

Then the readout circuit 12 applies read voltages to the column lines 204, 205 and 206. More particularly, the readout circuit 12 applies a read voltage $X_1$ to the column line 204, a read voltage $X_2$ to the column line 205 and a read voltage $X_3$ to the column line 206. Hence the read voltages represent vector values of the vector of the matrix-vector multiplication.

Furthermore, the readout circuit 12 reads out current values of the row lines 201, 202 and 203. As an example, the readout circuit 12 reads out a current value $b_1$ from the row line 201, which is the sum of three multiplications, namely $$b_1 = A_{11}X_1 + A_{12}X_2 + A_{13}X_3.$$

Accordingly, the readout circuit 12 reads out a current value $b_2$ from the row line 202 and a current value $b_3$ from the row line 203. The current values represent the result values of the vector elements of the product vector b.

In a corresponding manner the readout circuit 12 may apply read voltages to the row lines 201, 202 and 203 and read out current values of the column lines 204, 205 and 206 to perform a transpose matrix-vector multiplication.

Figure 3:
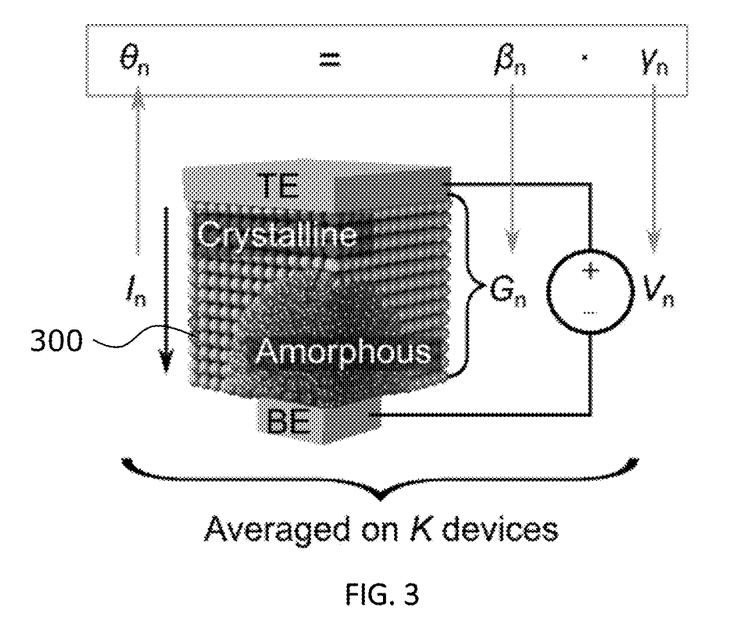
FIG. 3 illustrates an exemplary embodiment of a scalar multiplication to be performed by a phase change memory cell.

FIG. 3 illustrates an exemplary embodiment of a scalar multiplication that may be performed by a PCM cell 300. Such a scalar multiplication forms the basis of the matrix-vector multiplication performed according to embodiments of the disclosure. Let $\theta_n = \beta_n \cdot \gamma_n$, where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 is a slightly non-linear function of the voltage, the analogue scalar multiplication may be expressed to follow a "pseudo" OHM's law, namely by $$I_n \cong \alpha G_n \cdot f(V_n).$$

In this equation, $\alpha$ is a time dependent conductance variation parameter and f a function, in particular a polynomial function that approximates the current-voltage characteristics of the PCM cell 300. The PCM cell 300 may be programmed to the effective conductance $G_n$ by an iterative program and verify procedure. Then the readout circuit 12 may apply a read voltage $V_n$ and readout the current $I_n$. Finally, the current $I_n$ is converted back to approximate the value $\hat{\theta}_n$, representing the result of the scalar multiplication.

According to preferred embodiments, an averaging of the result over K memory elements/PCM cells is performed.

Figure 4:
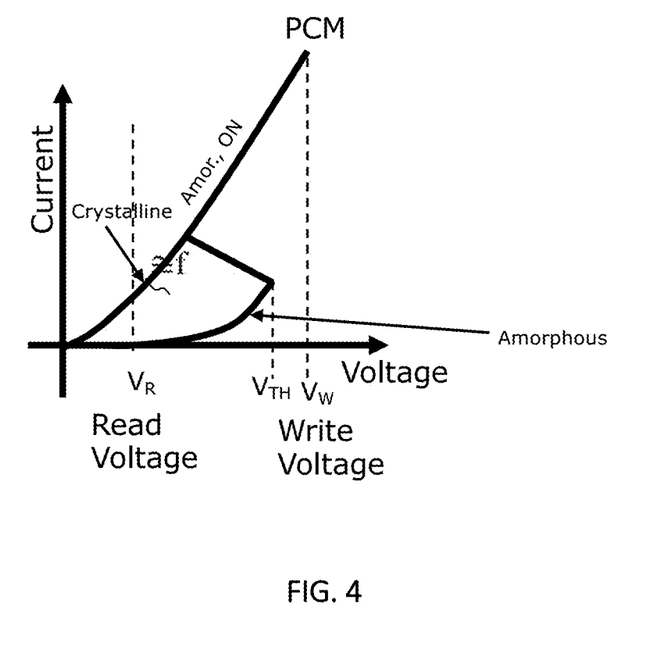
FIG. 4 is a schematic illustration of the current/voltage characteristics of the material components of the phase change memory cell.

FIG. 4 is a schematic illustration of the current/voltage (and hence resistance) characteristics of the material components of the memory cell 300 of FIG. 3. The solid lines indicate variation of current with voltage for the PCM material, starting from the fully-crystalline SET state (upper curve) and also the fully-amorphous RESET state (lower curve). These two curves reflect the large (typically 3 orders of magnitude) variation in resistivity between the crystalline and amorphous phases. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated.

As can be seen in FIG. 4, the current in the read mode is a slightly non-linear function of the voltage.

Figure 5:
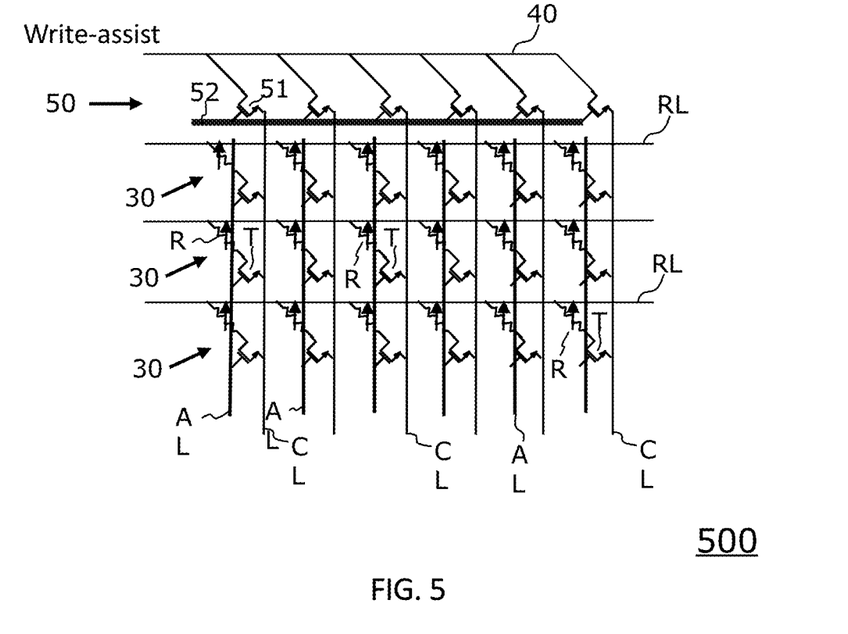
FIG. 5 shows a schematic illustration of a memory crossbar array according to an embodiment of the disclosure.

FIG. 5 shows a schematic illustration of a memory crossbar array 500 according to an embodiment of the disclosure. The memory crossbar array 500 comprises a plurality of row lines RL, a plurality of columns lines CL and a plurality of junctions 30 comprising a serial arrangement of a programmable resistive element R and a transistor T as access element. The transistor T may be embodied in particular as MOSFET.

The memory crossbar array 500 further comprises a plurality of vertical access lines AL, wherein each of the plurality of vertical access lines AL is coupled to a respective array of resistive memory elements R. More particularly, each vertical access line AL is coupled to the gates of the access transistors T of a corresponding column line CL. Hence by providing an appropriate control signal or in other words a select signal to one or more of the access lines AL, all the resistive memory elements R that are coupled to the respective access line AL can be simultaneously turned on or off or in other words selected or deselected.

The memory crossbar array 500 further comprises a write-assist wire 40 and a corresponding array 50 of switching elements 51. The switching elements 51 may be embodied as transistors, in particular as MOSFET transistors. The array 50 further comprises an access wire 52 for accessing or in other words turning on the write-assist wire 40. More particularly, the access wire 52 is coupled to the gates of the transistors 51. The sources and drains of the transistors 51 are arranged between the write-assist wire 40 and the column lines CL of the crossbar array 500. The write-assist wire 40 is hence connectable via the switching elements/transistors 51 to the plurality of column lines CL. More particularly, by providing an appropriate control signal or in other words a select signal to the access wire 52, the transistors 51 may be switched on/turned on and accordingly the write assist-wire 40 can be electrically connected to the column lines CL or in other words the write assist-wire 40 can be turned on. If the transistors 51 are switched off/turned off, the write assist wire 40 is also turned-off, i.e. it is not electrically connected to the column lines CL. The write-assist wire 40 provides a shunt path for programming signals during write operations which will be explained in more detail with reference to FIGS. 6 and 7.

Figure 6:
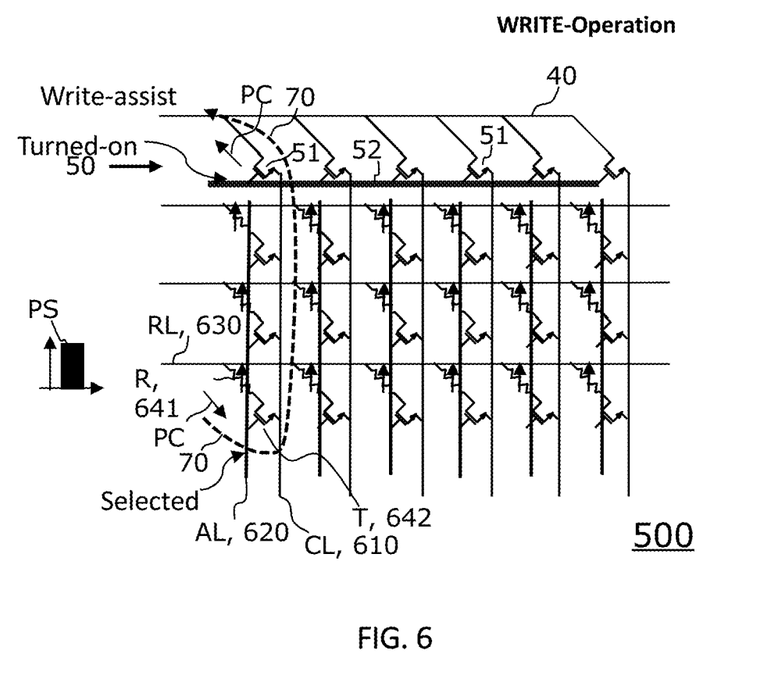
FIG. 6 illustrates a write-operation of an iterative matrix programming scheme of the memory crossbar array.
Figure 7:
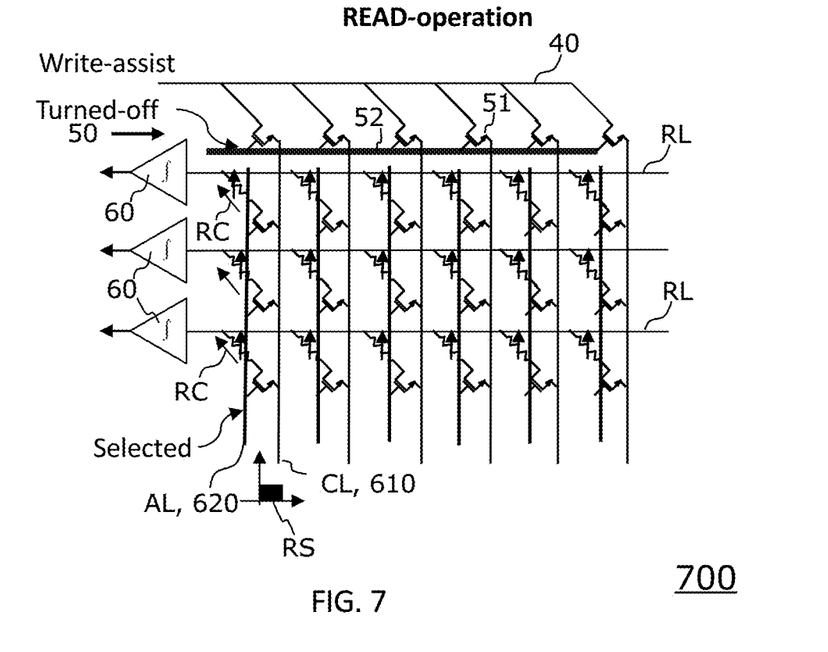
FIG. 7 illustrates a read operation of an iterative programming scheme of the memory crossbar array.

FIGS. 6 and 7 illustrate an iterative matrix programming of the memory crossbar array 500 of FIG. 5.

FIG. 6 shows a programming step. More particularly, the control circuitry 13 may apply a selection signal to select, e.g., the left column line CL, 610 of the crossbar array 500. This can be done by sending a selection signal S to the left access line AL, 620.

The signal generator 11 may apply then, under control of the control circuitry 13, to one or more of the row lines RL a programming signal PS, in particular a write voltage in the form of write pulses. In FIG. 6 only one write pulse is applied as programming signal PS to the lower row line RL, 630 of the crossbar array 500, while in general programming signals may be applied to a subset of the plurality of row lines. The programming signals are applied in order to program conductance values of the resistive elements for a matrix-vector multiplication to be performed subsequently with the crossbar array 500.

According to embodiments, the information to be written by the write pulses may be encoded in the amplitude of the write pulses or the length of the write pulses.

During the write operation the write-assist wire 40 has been turned on by means of the switching array 50. More particularly, a control signal/select signal has been applied to the access wire 52 and thereby to the gates of the transistors 51. Thereby the transistors 51 have been switched and the write assist-wire 40 has been electrically connected to the column line CL, 610. As a result, the programming signal PS results in a programming current PC that flows from the row line RL, 630, via the resistive element R, 641, the transistor T, 642, the column line CL, 610 and the transistor 51 to the write assist wire 40. Accordingly, a shunt path 70 has been provided for the programming current PC during the write operations.

The write operation as illustrated in FIG. 6 may be performed by single shot programming or iterative programming.

In iterative programming, in a first step a write operation as illustrated in FIG. 6 is performed. Then in a next step the result of the write operation is verified by a read operation.

FIG. 7 illustrates such a read operation of an iterative programming scheme for the memory crossbar array 500 of FIG. 5. For the read operation, the control circuitry 13 applies a selection signal S to the access line AL, 620. Then a read signal RS, in particular a read voltage, is applied to the column line CL, 610. As a result, a read current $I_{READ}$ may be measured by integration circuits 60 of the row lines RL and the resistance of the 3 selected resistive elements R of the left column line 610 may be determined. The write-assist wire 40 is turned off for the read operation.

This iterative process can be repeated as desired or needed until the desired resistance value has been reached for the selected resistive elements R.

According to other embodiments of the disclosure the iterative programming may also be performed with a variable read voltage which may use, e.g., the voltage dependence of the conductance of the resistive memory elements.

Figure 8:
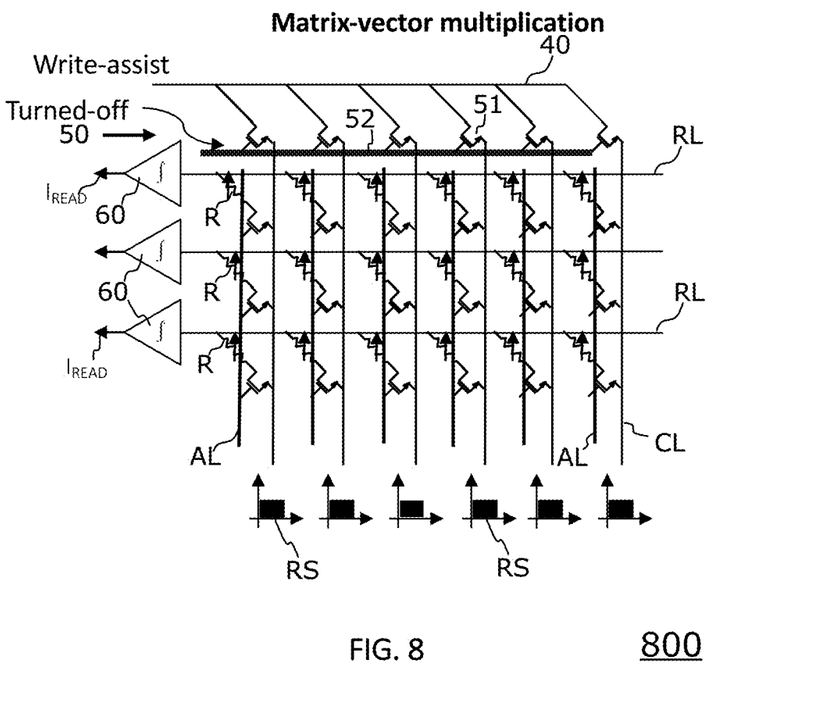
FIG. 8 illustrates the computation of a matrix vector multiplication performed by the memory crossbar array.

FIG. 8 illustrates the computation of a matrix vector multiplication performed by the memory crossbar array 500 of FIG. 5.

For the matrix-vector multiplication, all access lines AL have been selected. This can be implemented by sending by the control circuitry 13 a select signal S to all access lines AL. The matrix vector multiplication can then be performed by applying read signals RS, in particular voltage pulses, in parallel to the column lines CL. The input of the computation, in this example the vector values of the vector of the matrix-vector multiplication may be encoded as amplitude of the voltage pulses applied to the column lines or as time duration of the voltage pulses or as a sequence of binary voltage pulses. The result of the computation is obtained by measuring the read current $I_{READ}$ or an integral of the read current $I_{READ}$ over a fixed time duration by the integrating units 60.

The write-assist wire 40 is turned off for the corresponding read operation.

Figure 9:
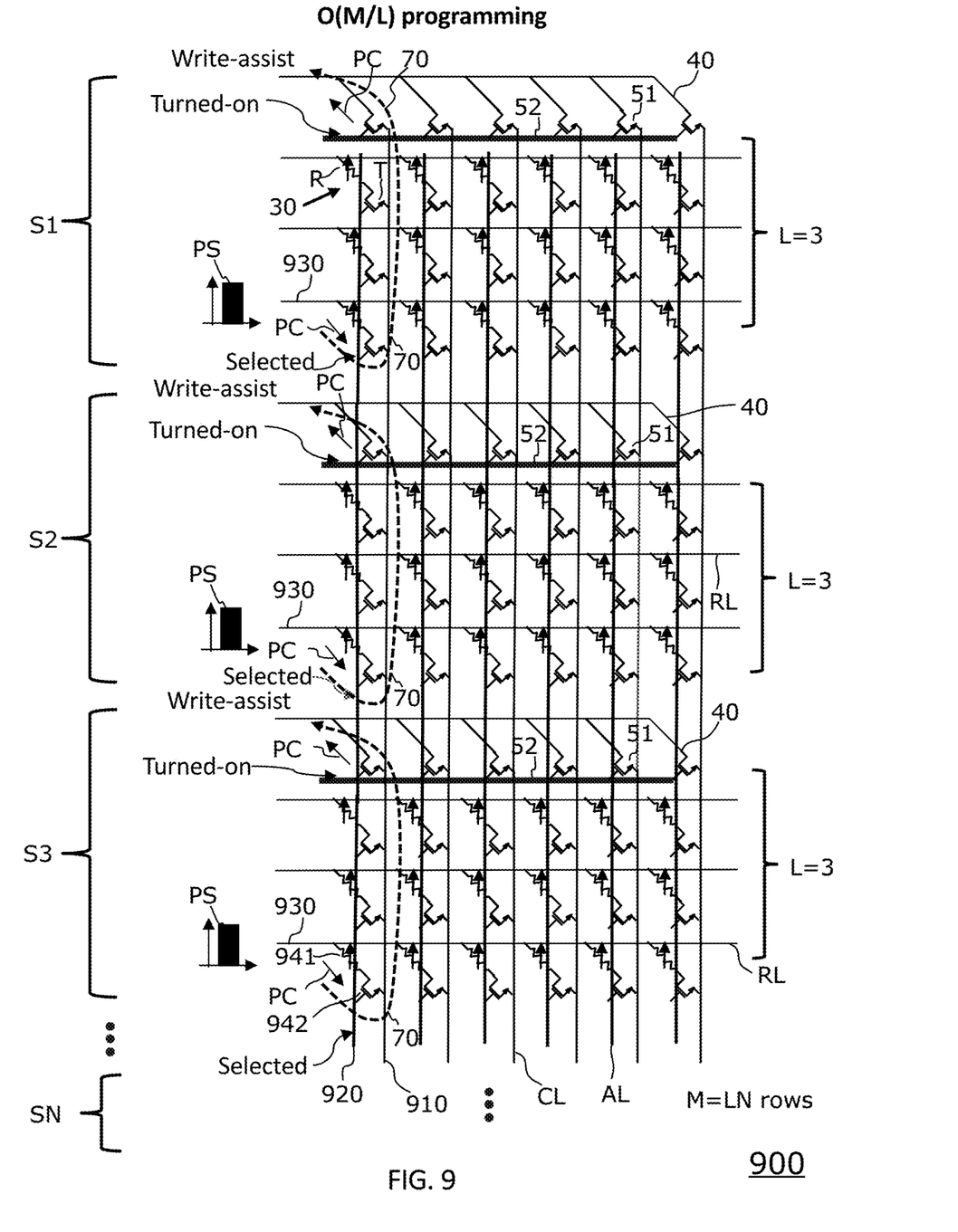
FIG. 9 shows an order of (M/L) programming by means of a crossbar array according to an embodiment of the disclosure.

FIG. 9 shows an order of (M/L) programming by means of a crossbar array 900 according to an embodiment of the disclosure. The memory crossbar array 900 comprises a plurality of M row lines RL, a plurality of column lines CL and a plurality of junctions 30 comprising a serial arrangement of a programmable resistive element R and an access transistor T as access element.

M is an integer and denotes the total number of row lines of the crossbar array 900. The memory crossbar array 900 is split in M/L segments, wherein L is also an integer and wherein each segment of the M/L segments comprises L row lines RL and an allocated write assist wire 40. In the illustrated example of FIG. 9 the memory crossbar array 900 comprises N segments S1, S2, . . . , SN, wherein three segments S1, S2 and S3 are illustrated in detail. Each of the N segments comprises L=3 row lines RL with an allocated write assist wire 40 and a corresponding array 50 comprising switching elements/transistors 51 and an access wire 52. The memory crossbar array 900 further comprises a plurality of vertical access lines AL coupled to the gates of the access transistors T of a corresponding column line CL.

The crossbar array 900 may be used to program during the write operations at least M/L resistive elements in parallel in one column line CL of the plurality of column lines. In other words, at least one resistive element of a column line of each segment may be programmed in parallel. In the example of FIG. 9 a programming signal PS is applied to the lower row lines 930 of the segments S1, S2 and S3. For the programming the write-assist wires 40 are turned on. More particularly, a control signal/select signal is applied to the access wire 52 and thereby to the gates of the transistors 51. Thereby the transistors 51 are switched and the write assist-wire 40 is electrically connected to the left column line CL, 910. Furthermore, the control circuitry 13 applies a selection signal to select the left column line CL, 910 of the crossbar array 900. This can be done by sending a selection signal S to the left access line AL, 920. As a result, in each of the segments S1, S2 and S3 (and possibly further segments S4, . . . , SN) the programming signal PS results in a programming current PC that flows from the row line 930, via the resistive element 941, the transistor 942, the column line 910 and the transistor 51 to the write-assist wire 40. Accordingly, in each of the segments S1, S2, S3, . . . , SN a shunt path 70 has been provided for the programming current PC during the write/programming operations. Hence the memory crossbar array 900 enables a parallel programming.

According to embodiments, the signal generator 13 may be configured to program more than one resistive element per segment in parallel if the programming signal/programming current is sufficiently low. More particularly, the respective shunt path 70 serves as common current path for all the resistive elements of the rows of a segment and hence the maximum programming current is limited by the maximum current which the column line of a segment may carry. However, due to the M/L write-assist wires 40, the programming current of the respective column line is reduced by the number of segments, i.e. by the factor L/M. In other words, the plurality of segments distributes the programming current of the respective column line over the N segments S1, S2, S3, . . . , SN by means of the write-assist wires 40.

Figure 10:
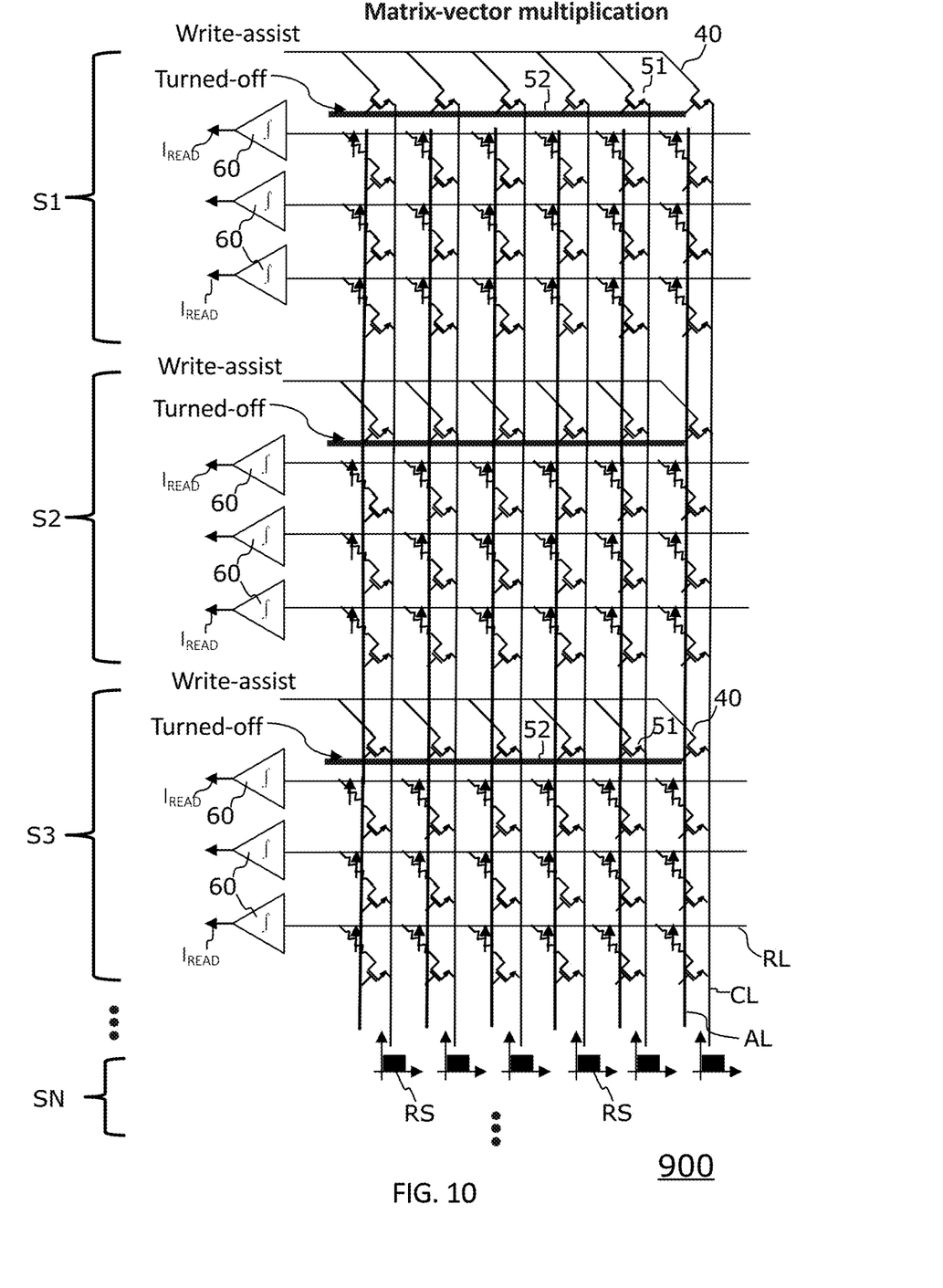
FIG. 10 illustrates a matrix-vector multiplication performed in the memory crossbar array.

FIG. 10 illustrates a matrix-vector multiplication performed in the memory crossbar array 900 of FIG. 9.

For the matrix-vector multiplication, all access lines AL have been selected. This can be implemented by sending by the control circuitry 13 a select signal S to all access lines AL. The matrix-vector multiplication can then be performed with O(1) complexity by applying read signals RS, in particular voltage pulses, in parallel to the column lines CL. The input of the computation, in this example the vector values of the vector of the matrix-vector multiplication may be encoded as amplitude of the voltage pulses applied to the column lines, as time duration of the voltage pulses or as a sequence of binary voltage pulses. The result of the computation is obtained by measuring the read currents $I_{READ}$ or an integral of the read current $I_{READ}$ over a fixed time duration by the integrating units 60. The write-assist wires 40 are turned off for the corresponding read operation. According to embodiments the device may perform multiple runs for the matrix-vector multiplication and perform an averaging of result values of the multiple runs.

According to embodiments, the read-out circuit 12 may apply positive and negative read voltages as read signals RS to the column lines CL of the memory crossbar array 900.

Instead of applying the read voltages to the column lines CL, the read-out circuit 12 may apply according to embodiments read voltages to the row lines RL of the memory crossbar array 900. Thereby transpose matrix-vector multiplications may be performed by the crossbar array 900. According to such an embodiment the results of the matrix-vector multiplication may be obtained by measuring the read currents or an integral of the read current over a fixed time duration by integrating units arranged at the column lines CL.

Figure 11:
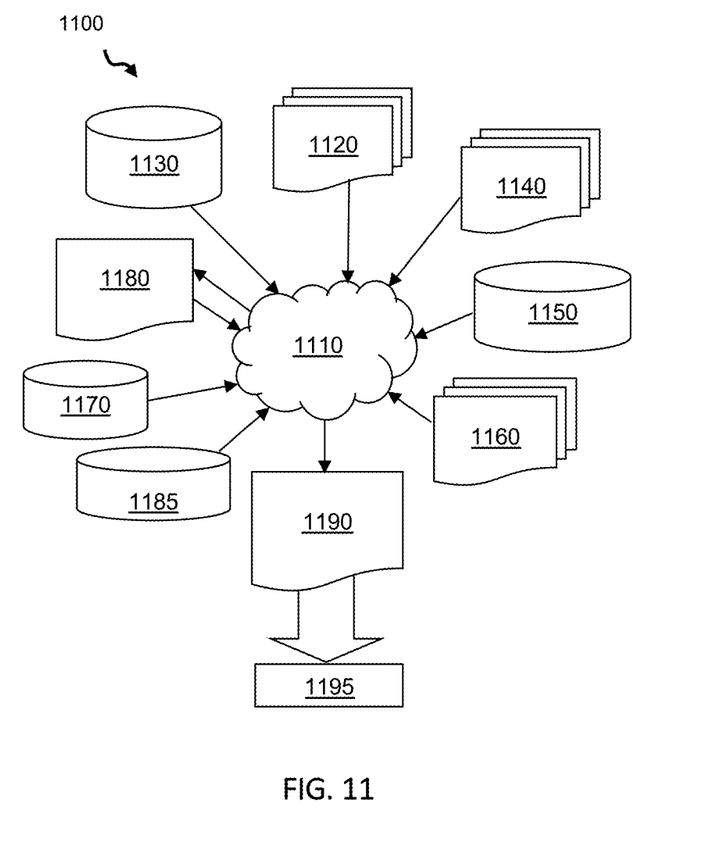
FIG. 11 shows a block diagram of an exemplary design flow.

FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices described above and shown, e.g., in FIGS. 1-10. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 1-10. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 1-10 to generate a Netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including Netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the disclosure. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190. Design structure 1190 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the disclosure shown in FIGS. 1-10. In one embodiment, design structure 1190 may comprise a compiled, executable HDL simulation model that functionally simulates the devices shown in FIGS. 1-10.

Design structure 1190 may also employ a data format used for the exchange of layout data of integrated circuits and/or symbolic data format (e.g., information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 1190 may then proceed to a stage 1195 where, for example, design structure 1190: proceeds to tape-out, is released to manufacturing, is released to a mask house, is sent to another design house, is sent back to the customer, etc.

Figure 12:
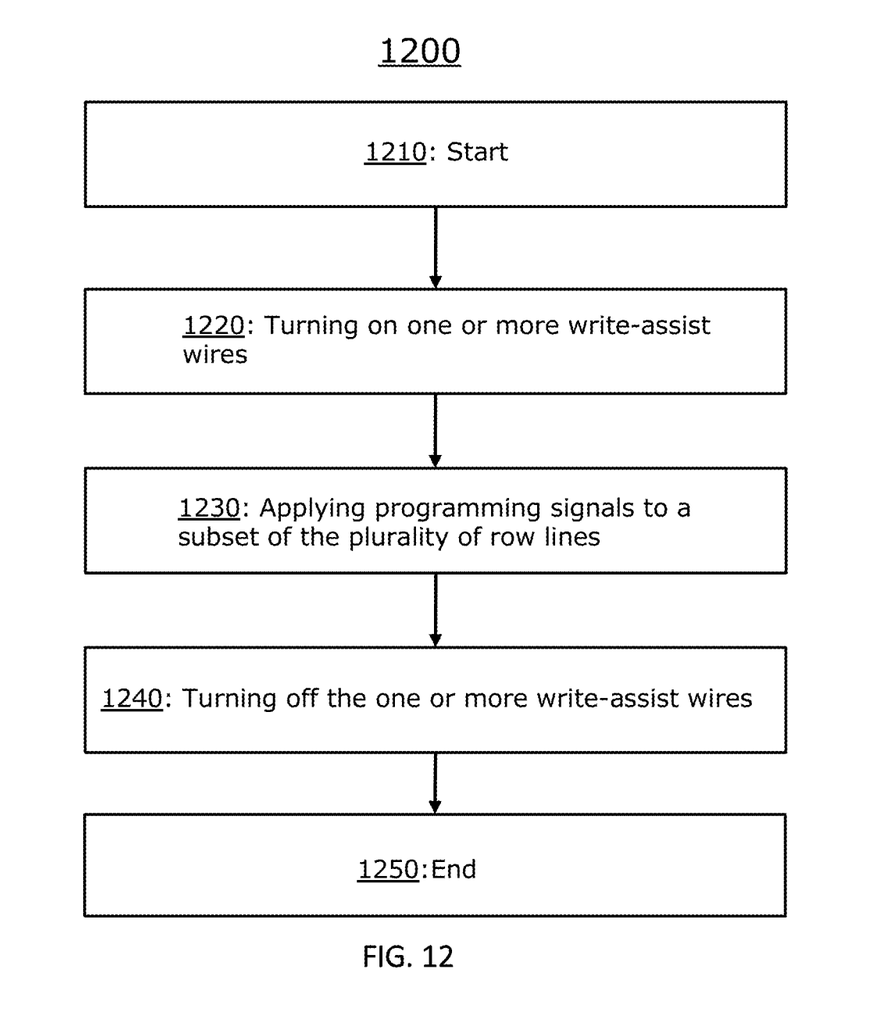
FIG. 12 shows a flow chart of method steps of a method for performing a matrix-vector multiplication of a matrix with a vector by means of a memory crossbar array.

FIG. 12 shows a flow chart of method steps of a method for performing a matrix-vector multiplication of a matrix with a vector. The method may be performed, e.g., by means of the memory crossbar array 500 of FIG. 5 or the memory crossbar array 900 of FIG. 9.

The method starts at a step 1210.

At a step 1220, the control circuitry 13 turns on the one or more write-assist wires during the write operations by means of the one or more arrays of switching elements.

At a step 1230, the signal generator 11 applies programming signals to a subset of the plurality of row lines to program conductance values of the resistive elements for the matrix-vector multiplication.

At a step 1240, the control circuitry 13 turns off the one or more write-assist wires.

At a step 1250, the method ends.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A device for performing a matrix-vector multiplication of a matrix with a vector, the device comprising:
   a memory crossbar array comprising
   a plurality of row lines;
   a plurality of column lines;
   a plurality of junctions arranged between the plurality of row lines and the plurality of column lines, wherein each junction comprises a programmable resistive element and an access element for accessing the programmable resistive element; and
   one or more write-assist wires and one or more corresponding arrays of switching elements, wherein the write-assist wires are connectable via the switching elements to the plurality of column lines,
   wherein the device is configured to perform write operations by:
      applying programming signals to a subset of the plurality of row lines to program conductance values of the resistive elements for the matrix-vector multiplication, and
      turning on the one or more write-assist wires during the write operations by means of the one or more arrays of switching elements, thereby providing one or more shunt paths for the programming signals during the write operations.

2. The device according to claim 1, wherein the device comprises:
   a readout circuit configured to apply read voltages to the column lines of the memory crossbar array; and
   read out current values of row lines of the memory crossbar array.

3. The device according to claim 1, wherein:
   the memory crossbar array is split in a plurality of segments;
   each segment of the plurality of segments comprises a plurality of row lines; and
   each segment of the plurality of segments comprises an allocated write-assist wire of the one or more write-assist wires.

4. The device according to claim 1, wherein:
   the memory crossbar array comprises M row lines;
   the memory crossbar array is split in M/L segments, wherein M and L are integers, and wherein each segment of the M/L segments comprises L row lines and an allocated write assist wire of the one or more write-assist wires.

5. The device according to claim 4, wherein the device is configured to program during the write operations at least M/L devices in parallel in one column line of the plurality of column lines.

6. The device according to claim 2, wherein:
the conductance values represent matrix values of the matrix of the matrix-vector multiplication;
the read voltages represent vector values of the vector of the matrix-vector multiplication; and
the current values represent result values of vector elements of a product vector of the matrix-vector multiplication.

7. The device according to claim 1, wherein the junctions comprise a serial arrangement of a resistive element and an access transistor.

8. The device according to claim 1, wherein the write-assist wires are arranged in parallel to the row lines.

9. The device according to claim 1, wherein the switching elements are embodied as transistors.

10. The device according to claim 2, wherein information of the read voltages is encoded as a duration of a read voltage pulse and/or a voltage level of a read voltage pulse.

11. The device according to claim 2, wherein information of the read voltages is encoded as a sequence of binary voltage pulses.

12. The device according to claim 1, wherein the device is configured to
perform multiple runs for the matrix-vector multiplication; and
perform an averaging of result values of the multiple runs.

13. The device as claimed in claim 1, wherein the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

14. The device according to claim 1, wherein the device comprises a signal generator, the signal generator being configured to program the conductance values of the resistive elements by an iterative program and verify procedure.

15. The device according to claim 2, wherein the readout circuit is configured to apply positive and negative read voltages to the column lines of the memory crossbar array.

16. The device according to claim 2, wherein the readout circuit is configured to apply read voltages to the row lines of the memory crossbar array for performing transpose matrix-vector multiplications.

17. A design structure tangibly embodied in a machine readable medium for designing, manufacturing, or testing an integrated circuit, the design structure comprising:
a device for performing a matrix-vector multiplication of a matrix with a vector, the device comprising:
a memory crossbar array comprising
a plurality of row lines;
a plurality of column lines;
a plurality of junctions arranged between the plurality of row lines and the plurality of column lines, wherein each junction comprises a programmable resistive element and an access element for accessing the programmable resistive element; and
one or more write-assist wires and one or more corresponding arrays of switching elements, wherein the write-assist wires are connectable via the switching elements to the plurality of column lines,
wherein the device is configured to perform write operations by:
applying programming signals to a subset of the plurality of row lines to program conductance values of the resistive elements for the matrix-vector multiplication, and
turning on the one or more write-assist wires during the write operations by means of the one or more arrays of switching elements, thereby providing one or more shunt paths for the programming signals during the write operations.

18. The design structure according to claim 17, the device further comprising:
a readout circuit configured to apply read voltages to the column lines of the memory crossbar array; and
read out current values of row lines of the memory crossbar array.

19. The design structure according to claim 17, wherein the memory crossbar array of the device is split in a plurality of segments;
each segment of the plurality of segments comprises a plurality of row lines; and
each segment of the plurality of segments comprises an allocated write-assist wire.

20. A method for performing a matrix-vector multiplication of a matrix with a vector by a memory crossbar array, wherein the memory crossbar array includes:
a plurality of row lines,
a plurality of column lines,
a plurality of junctions arranged between the plurality of row lines and the plurality of column lines, wherein each junction comprises a programmable resistive element and an access element for accessing the programmable resistive element, and
one or more write-assist wires and one or more corresponding arrays of switching elements; wherein the write-assist wires are connectable via the switching elements to the plurality of column lines, and wherein the method comprises:
performing write operations by applying programming signals to a subset of the plurality of row lines to program conductance values of the resistive elements for the matrix-vector multiplication; and
turning on the one or more write-assist wires during the write operations by means of the one or more arrays of switching elements, thereby providing one or more shunt paths for the programming signals during the write operations.

* * * * *